US012593523B2

(12) United States Patent　　　　　(10) Patent No.:　　US 12,593,523 B2

Huang et al.　　　　　　　　　　　　　(45) Date of Patent:　　Mar. 31, 2026

(54) IMAGE SENSOR DEVICE WITH LIGHT BLOCKING STRUCTURE AND ADHESION LAYER EMBEDDED IN OXIDE LAYER

(71) Applicant: TAIWAN SEMICONDUCTOR MANUFACTURING CO., LTD., Hsinchu (TW)

(72) Inventors: Zen-Fong Huang, Tainan City (TW); Fu-Cheng Chang, Tainan City (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 5 days.

(21) Appl. No.: 18/305,261

(22) Filed: Apr. 21, 2023

(65) Prior Publication Data

US 2023/0261023 A1　　Aug. 17, 2023

Related U.S. Application Data

(62) Division of application No. 16/900,683, filed on Jun. 12, 2020, now Pat. No. 11,664,403.

(51) Int. Cl.
H10F 39/00　　　　　(2025.01)

(52) U.S. Cl.
CPC ......... *H10F 39/807* (2025.01); *H10F 39/024* (2025.01); *H10F 39/8057* (2025.01); *H10F 39/8053* (2025.01); *H10F 39/8063* (2025.01)

(58) Field of Classification Search
CPC ........... H01L 27/1463; H01L 27/14623; H01L 27/14685; H01L 27/14621; H01L 27/14627; H10F 39/024; H10F 39/199; H10F 39/8053; H10F 39/8057; H10F 39/8063; H10F 39/807

See application file for complete search history.

(56) References Cited

U.S. PATENT DOCUMENTS

| 10,811,453 B1 | 10/2020 | Mun et al. |
| 2012/0286418 A1 | 11/2012 | Lee et al. |
| 2014/0054662 A1* | 2/2014 | Yanagita ........... H01L 27/14645 |
| | | 438/73 |
| 2015/0221692 A1 | 8/2015 | Enomoto et al. |
| 2018/0301490 A1* | 10/2018 | Dofuku ................. H10F 39/807 |
| 2019/0139997 A1 | 5/2019 | Chiang et al. |
| 2021/0183924 A1* | 6/2021 | Manda .................. H10F 39/199 |
| 2021/0249454 A1* | 8/2021 | Suzuki ............... H01L 27/1463 |

* cited by examiner

*Primary Examiner* — Nelson Garces
(74) *Attorney, Agent, or Firm* — Maschoff Brennan

(57)　　　　ABSTRACT

An image sensor device includes a substrate, a deep-trench isolation structure, an oxide layer, a light blocking structure, and an adhesion layer. The substrate has a photosensitive region. The deep-trench isolation structure is in the substrate and adjacent the photosensitive region. The oxide layer is over the photosensitive region and the deep-trench isolation structure. The light blocking structure is over the oxide layer. A bottom portion of the light blocking structure is embedded in the oxide layer. The adhesion layer is between the light blocking structure and the oxide layer. The adhesion layer extends beyond a sidewall of a top portion of the light blocking structure.

20 Claims, 16 Drawing Sheets

100

172

121

195

A

A

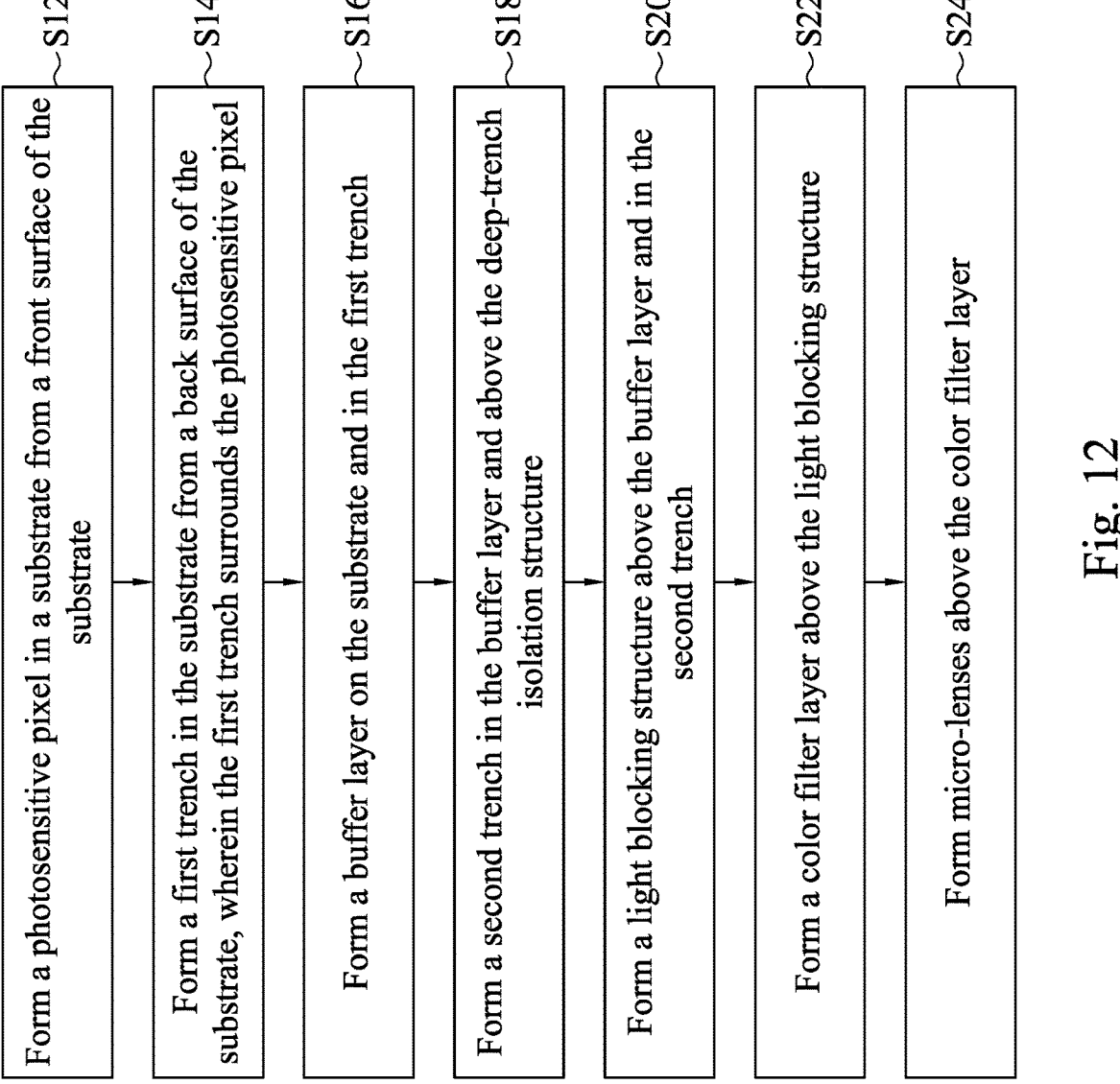

M

Form a photosensitive pixel in a substrate from a front surface of the substrate    S12

Form a first trench in the substrate from a back surface of the substrate, wherein the first trench surrounds the photosensitive pixel    S14

Form a buffer layer on the substrate and in the first trench    S16

Form a second trench in the buffer layer and above the deep-trench isolation structure    S18

Form a light blocking structure above the buffer layer and in the second trench    S20

Form a color filter layer above the light blocking structure    S22

Form micro-lenses above the color filter layer    S24

Fig. 12

IMAGE SENSOR DEVICE WITH LIGHT BLOCKING STRUCTURE AND ADHESION LAYER EMBEDDED IN OXIDE LAYER

PRIORITY CLAIM AND CROSS-REFERENCE

This application is a divisional application of the U.S. application Ser. No. 16/900,683, filed Jun. 12, 2020, which is hereby incorporated by reference in its entirety.

BACKGROUND

Image sensors generate electrical signals in response to the stimulation of photons. The magnitudes of the electrical signals (such as the photo-current) depend on the intensity of the incident light received by the respective image sensors. The image sensors may suffer from non-optically generated signals, which include the leakage signals, thermally generated signals, dark currents, and the like. Accordingly, the electrical signals generated by the image sensors are then calibrated, so that the undesirable signals are cancelled out from the output signals of the image sensors. To cancel the non-optically generated signals, black reference image sensors are formed, and are used to generate non-optically generated signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 is a flow chart of a method for forming an image sensor device in accordance with some embodiments of the present disclosure.

DETAILED DESCRIPTION

Figure 1:
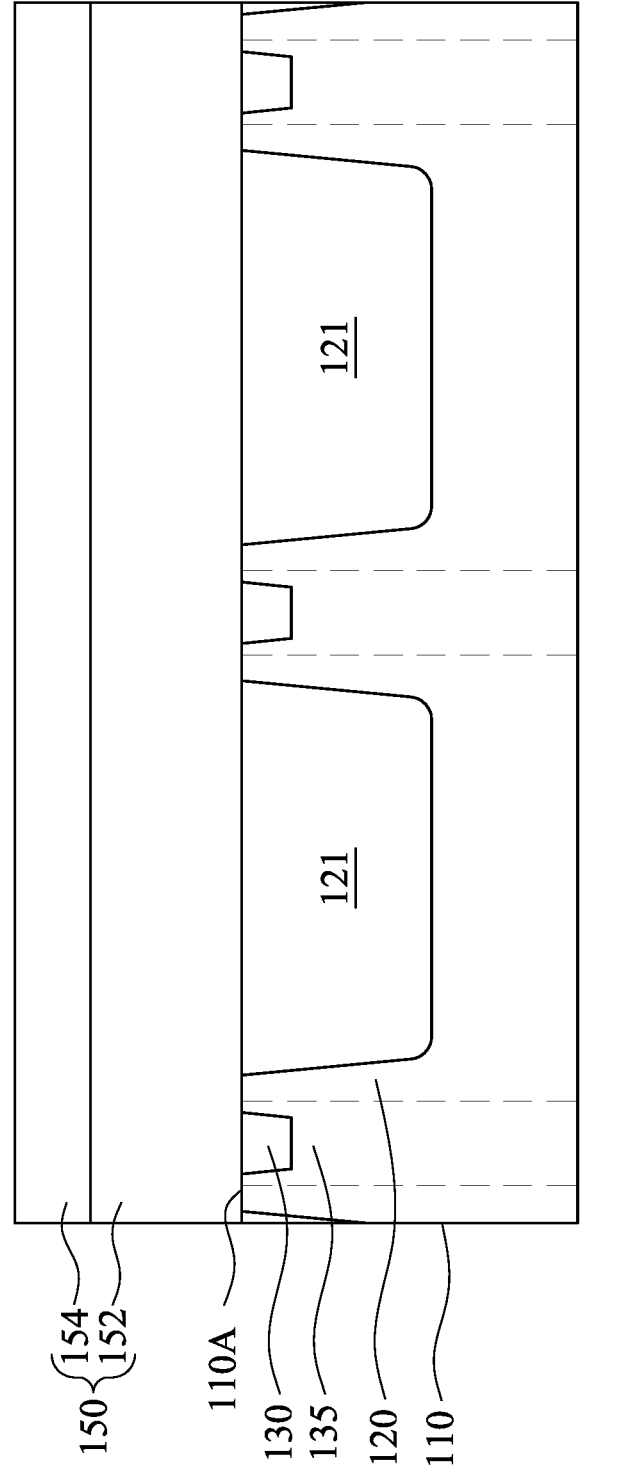
FIGS. 1-9C illustrate a method for fabricating an image sensor device at various intermediate stages of manufacture according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

An improved light blocking structure in a Backside Illumination (BSI) image sensor chip and the methods of forming the same are provided in accordance with various exemplary embodiments. The BSI image-sensor device includes a charge-coupled device (CCD), a complementary metal oxide semiconductor (CMOS) image sensor (CIS), an active-pixel sensor (APS) or a passive-pixel sensor. The image sensing device may include additional circuitry and input/outputs that are provided adjacent to the grid of pixels for providing an operation environment of the pixels and for supporting external communication with the pixels. The intermediate stages of forming the metal shield structure are illustrated. The variations of the embodiments are discussed. Throughout the various views and illustrative embodiments, like reference numbers are used to designate like elements.

FIGS. 1-9C illustrate a method for fabricating an image sensor device 100 at various intermediate stages of manufacture according to some embodiments of the present disclosure. For simplicity, some components of the image sensor device 100 are omitted. The illustration is merely exemplary and is not intended to be limiting beyond what is specifically recited in the claims that follow. It is understood that additional operations may be provided before, during, and after the operations shown by FIGS. 1-9C, and some of the operations described below can be replaced or eliminated for additional embodiments of the method. The order of the operations/processes may be interchangeable.

Photosensitive pixels 120 are formed in a substrate 110. The substrate 110 may include, for example, bulk silicon, doped or undoped, or an active layer of a semiconductor-on-insulator (SOI) substrate. In some embodiments, an SOI substrate includes a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 110 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

The photosensitive pixels 120 are formed at the front surface 110A of the substrate 110. The photosensitive pixels 120 may include respective photosensitive regions 121, which may be formed, for example, by implanting suitable impurity ions into the substrate 110 from the front surface 110A of the substrate 110. In some embodiments, impurity ions may be implanted in an epitaxial layer (not illustrated) within the substrate 110. The photosensitive regions 121 of the photosensitive pixels 120 are configured to covert light signals (e.g., photons) to electrical signals, and may be PN junction photo-diodes, PNP photo-transistors, NPN photo-transistors, or the like. For example, the photosensitive regions 121 may include an n-type implantation region formed within a p-type semiconductor layer (e.g., at least a portion of the substrate 110). In such embodiments, the p-type semiconductor layer may isolate and reduce electrical cross-talk between adjacent photo-active regions of the photosensitive pixels 120. In some embodiments, the photosensitive regions 121 may include a p-type implantation region formed within an n-type semiconductor layer (e.g., at least a portion of the substrate 110).

Figure 9A:
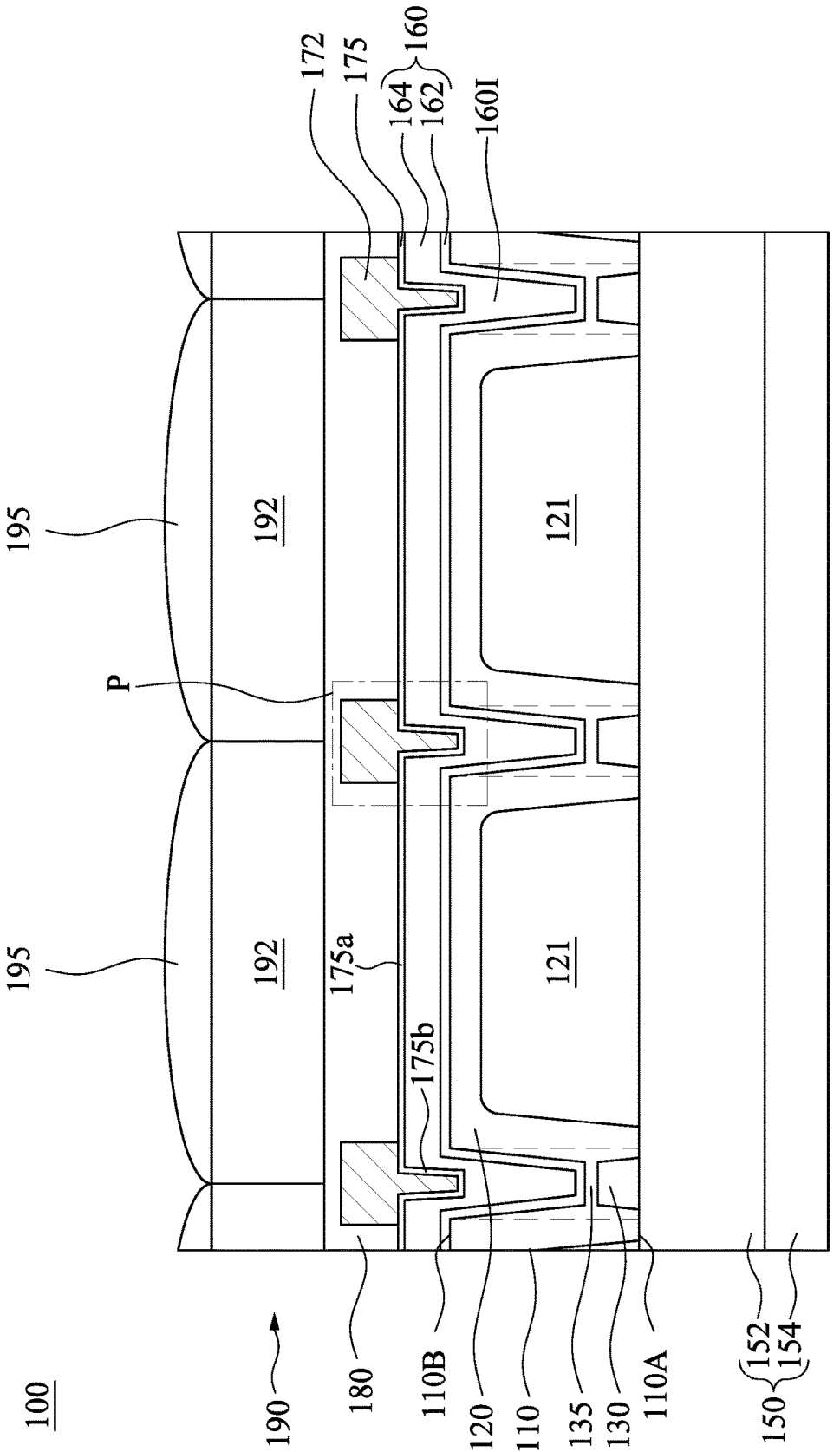
Figure 9B:
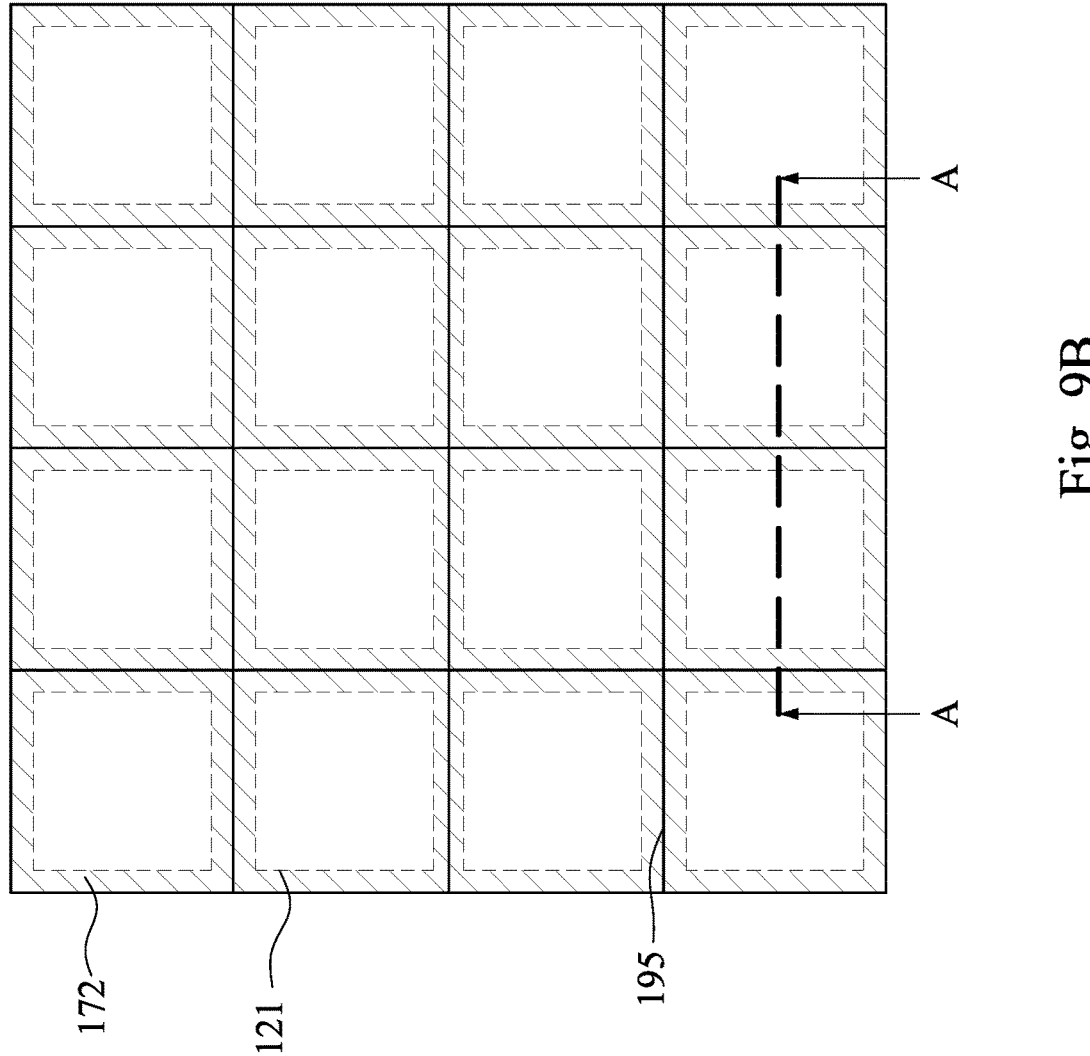

In some embodiments, the photosensitive pixels 120 form a photosensitive pixel array, such as a two-dimensional rectangular array as viewed from top (see FIG. 9B). In some embodiments, each photosensitive pixel 120 may further include a transfer gate transistor (not illustrated) and a floating diffusion capacitor (not illustrated). In each photosensitive pixel 120, a first source/drain region of the corresponding transfer gate transistor is electrically coupled to a respective photosensitive region 121, and a second source/drain region of the corresponding transfer gate transistor is electrically coupled to a respective floating diffusion capacitor.

Prior to the formation of the photosensitive regions 121, isolation features 130 may be formed at the front surface 110A of the substrate 110. In some embodiments, the isolation features 130 may include shallow trench isolation (STI) structures. In some embodiments, the STI structures may be formed by patterning the front surface 110A of the substrate 110 to form trenches in the substrate 110 and filling the trenches with suitable dielectric materials to form the STI structures. The dielectric materials may include silicon oxides. In some embodiments, the substrate 110 is patterned using suitable photolithography and etching process. In some other embodiments, the isolation features 130 may include various doped regions formed using suitable implantation processes.

Prior to the formation of the isolation features 130, in some embodiments, doped isolation regions 135 are formed in the substrate 110 to isolate the photosensitive regions 121 of the photosensitive pixels 120 from each other. The doped isolation regions 135 have a doping polarity opposite to that of the photosensitive regions 121 to reduce the dark current and white pixel defects. The doped isolation regions 135 are formed adjacent to or near the front surface 110A of the substrate 110. Each pair of neighboring photosensitive regions 121 is separated from one another by one of the respective doped isolation regions 135. The doped isolation regions 135 are doped with a doping polarity the same as that of the substrate 110. In some embodiments, the doping concentration of the doped isolation regions 135 is higher than that of the substrate 110. The doped isolation regions 135 are formed by one or more implantation processes or diffusion processes.

An interconnect structure 150 may be formed on the front surface 110A of the substrate 110, thereby forming electrical circuits with the photosensitive pixels 120. The interconnect structure 150 may include an ILD layer 152 and/or IMD layers 154 containing conductive features (e.g., conductive lines and vias including copper, aluminum, tungsten, combinations thereof, and the like) formed using any suitable method, such as damascene, dual damascene, or the like. The ILD 152 and IMDs 154 may include low-k dielectric materials having k values, for example, lower than about 4.0 or even 2.0 disposed between such conductive features. In some embodiments, the ILD 152 and IMDs 154 may be made of, for example, phosphosilicate glass (PSG), boro-phosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spinning, chemical vapor deposition (CVD), plasma-enhanced CVD (PECVD), or the like.

In some embodiments, prior to the formation of the interconnect structure 150, one or more active and/or passive devices may be formed on the front surface 110A of the substrate 110 in addition to the photosensitive pixels 120 including the photosensitive regions 121, the transfer gate transistors, and the floating diffusion capacitors (not illustrated). The one or more active and/or passive devices may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for illustrative purposes only and are not meant to limit the present disclosure in any manner. Other circuitry may be used as appropriate for a given application.

Figure 2:
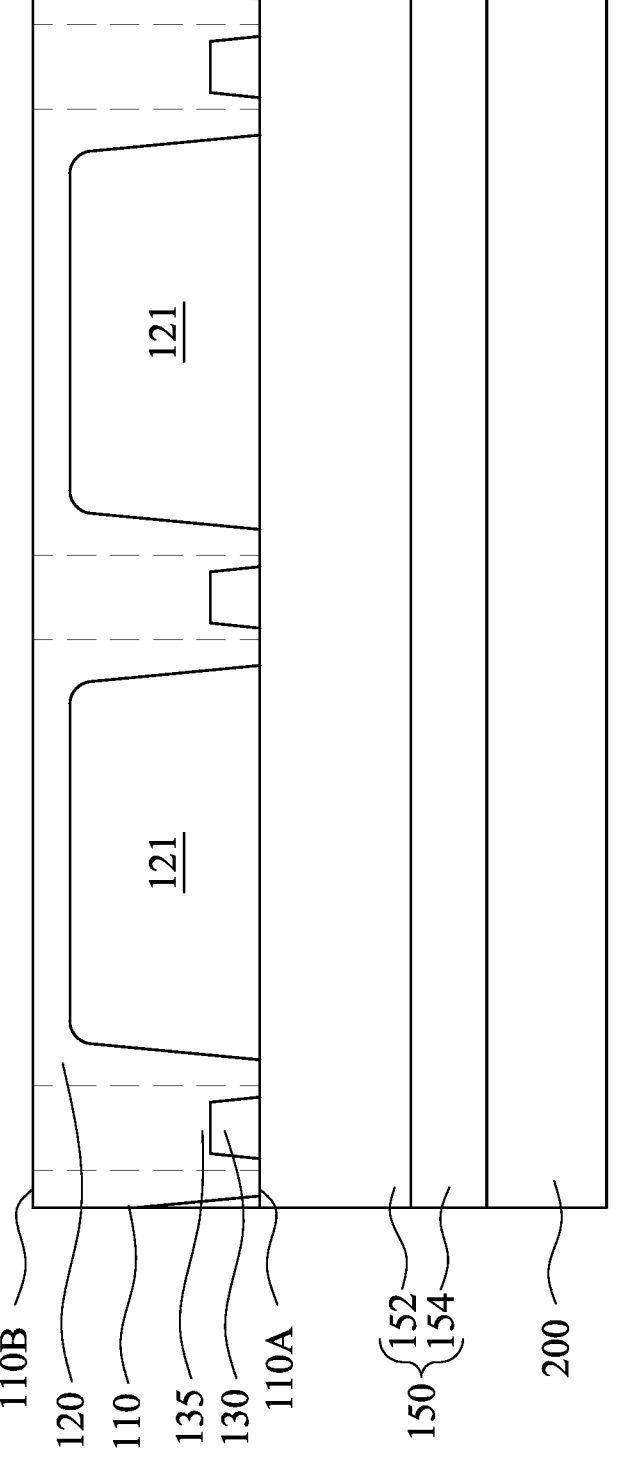

Reference is made to FIG. 2. The structure of FIG. 1 is flipped and optionally bonded to a carrier substrate 200 such that the front surface 110A of the substrate 110 faces the carrier substrate 200 and a back surface 110B of the substrate 110 is exposed for further processing. Various bonding techniques may be employed to achieve bonding between the structure of FIG. 1 and the carrier substrate 200. In some embodiments, the bonding techniques may include for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), hybrid bonding, adhesive bonding, anodic bonding, any combinations thereof and/or the like. In some embodiments, the carrier substrate 200 may provide mechanical support for processing operations performed on the back surface 110B of the substrate 110. In some embodiments, the carrier substrate 200 may be formed of silicon or glass and may be free from electrical circuitry formed thereon. In such embodiments, the carrier substrate 200 provides temporary support and is de-bonded from the image sensor device 100 (see FIG. 9A) after finishing the process operations performed on the back surface 110B of the substrate 110. In some other embodiments, the carrier substrate 200 may include a semiconductor substrate (not illustrated), one or more active devices (not illustrated) on the semiconductor substrate, and an interconnect structure (not illustrated) over the one or more active devices. In such embodiments, in addition to providing the mechanical support, the carrier substrate 200 may provide additional electrical functionality to the image sensor device depending on design requirements.

After the structure of FIG. 1 is flipped and bonded to the carrier substrate 200, a thinning process may be performed on the back surface 110B of the substrate 110 to thin the substrate 110. In some embodiments, the thinning process serves to allow more light to pass through from the back surface 110B of substrate 110 to the photosensitive regions 121 of the photosensitive pixels 120 without being absorbed by the substrate 110. In some embodiments in which the photosensitive regions 121 are fabricated in an epitaxial layer, the back surface 110B of the substrate 110 may be thinned until the epitaxial layer is exposed. The thinning process may be implemented by using suitable techniques such as grinding, polishing, a SMARTCUT® procedure, an ELTRAN® procedure, and/or chemical etching.

Figure 3:
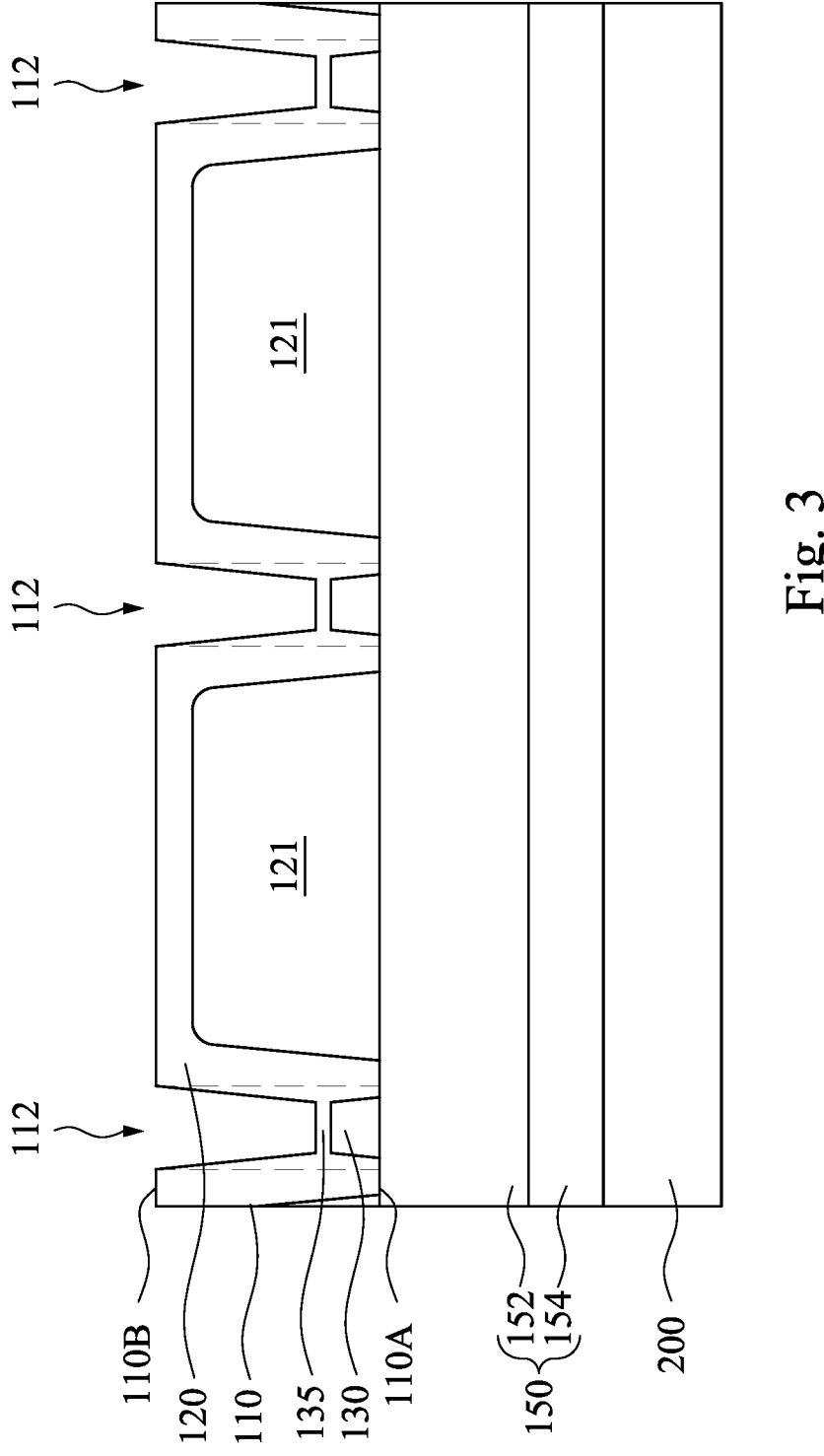

Reference is made to FIG. 3. The back surface 110B of the substrate 110 is patterned to form plural trenches 112 in the substrate 110. In some embodiments, the trenches 112 are formed in the doped isolation regions 135. In some embodiments, the back surface 110B of the substrate 110 is patterned using a suitable anisotropic wet etching process, while using a patterned mask (e.g., photoresist or a non-photosensitive material, such as silicon nitride) as an etch mask. In some embodiments in which the substrate 110 is formed of silicon, the anisotropic wet etch may be performed using potassium hydroxide (KOH), ethylenediamine pyrocatechol (EDP), tetramethylammonium hydroxide (TMAH), or similar. The patterned mask may be removed after the etching process. In some embodiments in which the patterned mask is formed of a photoresist, the patterned mask may be removed using an ashing processes followed by a wet clean process. In other embodiments in which the patterned mask is formed of a non-photosensitive material, the patterned mask may be removed using a suitable etching process.

Figure 4:
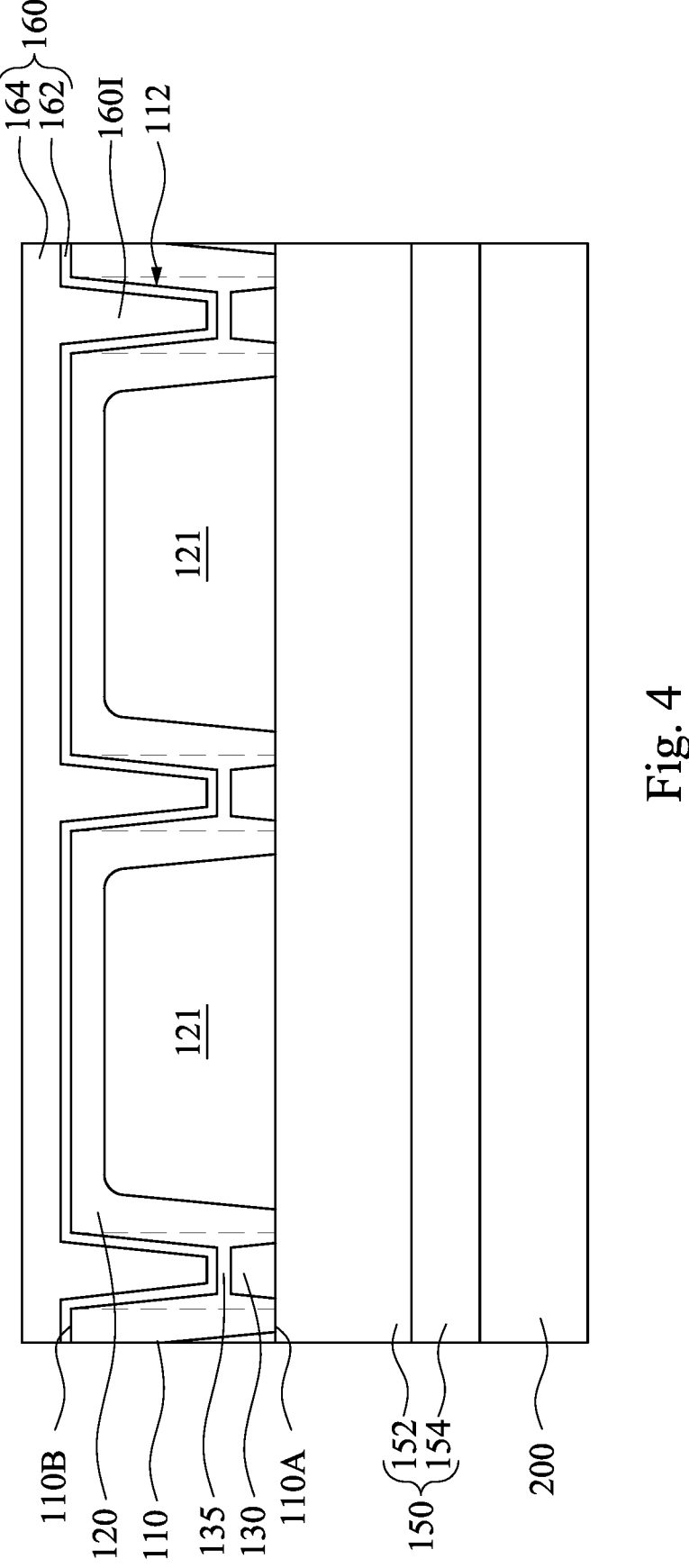

Reference is made to FIG. 4. After forming the trenches 112, a dielectric layer 160 is formed on the back surface 110B of the substrate 110, thereby filling the trenches 112. The dielectric layer 160 may include a charge accumulation layer 162 conformally formed on the back surface 110B of the substrate 110 and a buffer layer 164 over the charge accumulation layer 162. In some embodiments, after the buffer layer 164 is deposited above the charge accumulation layer 162, a planarization process (e.g., a CMP process) is performed to planarize the top surface of the buffer layer 164 as shown in FIG. 4.

In some embodiments, the charge accumulation layer 162 may include one or plural high-k dielectric materials. For example, the charge accumulation layer 162 may include an HfO$_2$ layer and a Ta$_2$O$_5$ layer over the HfO$_2$ layer. The charge accumulation layer 162 helps to accumulate negative or positive charges in the substrate 110 to an interface between the charge accumulation layer 162 and the substrate 110 to form electric dipoles, which functions as a carrier barrier to trap defects such as dangling bonds. The configuration of the charge accumulation layer 162 may reduce leakage current of the image sensor devices.

In some embodiments, the buffer layer 164 may be formed of silicon oxide, although other suitable dielectric materials may be used. In some embodiments, the buffer layer 164 may be formed using ALD, CVD, PECVD, the like, or combinations thereof. In some embodiments, the charge accumulation layer 162 and the buffer layer 164 is planarized using a grinding process, a chemical mechanical polishing (CMP) process, an etching process, or the like. Through the configuration, portions of the charge accumulation layer 162 and the buffer layer 164 in the trenches 112 of the substrate 110 form the deep-trench isolation structures 1601 between neighboring photosensitive pixels 120 and in the doped isolation regions 135. The deep-trench isolation structures 1601 may prevent electrical cross-talk between the photosensitive pixels 120. The deep-trench isolation structures 1601 may be referred to as backside deep trench isolation (BDTI) structures. In some other embodiments, the charge accumulation layer 162 may be omitted.

Figure 5:
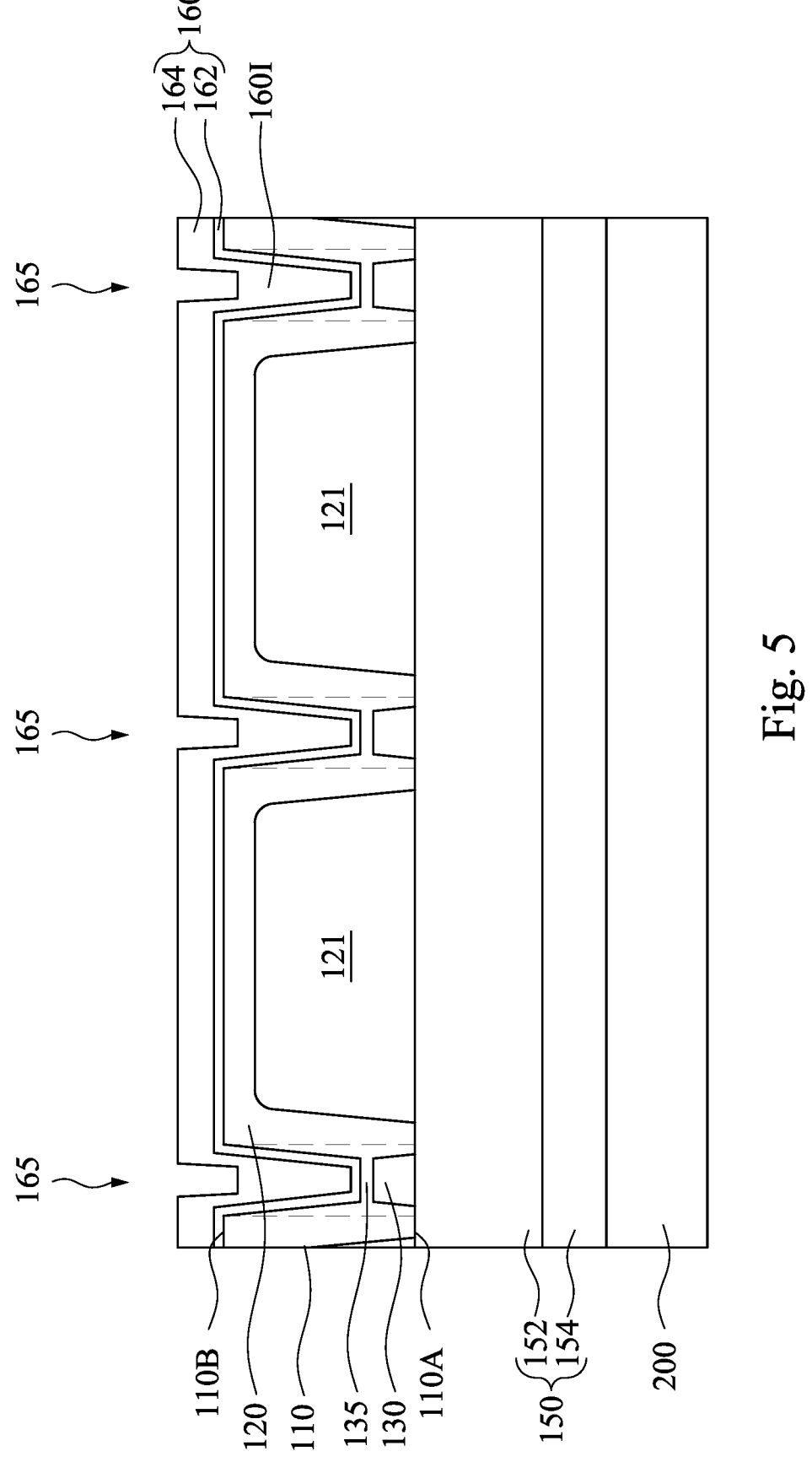

Reference is made to FIG. 5. The buffer layer 164 is patterned to form one or more trenches 165 therein and above the deep-trench isolation structures 1601. In some embodiments, the trenches 165 are formed directly above the deep-trench isolation structures 1601. In some embodiments, the buffer layer 164 may be patterned using suitable photolithography and etching processes. For example, a photoresist is coated over the buffer layer 164 (see FIG. 4) and then is patterned using photolithography techniques to expose portions of the buffer layer 164 above the deep-trench isolation structures 1601. Subsequently, an etching process is performed to recess the exposed portions of the buffer layer 164. In some embodiments, the trench 165 has a grid shape from a top view as illustrated in FIG. 9B. In some embodiments, the etching process is a dry etching process, a wet etching process, or combinations thereof. In some embodiments, since the trenches 165 are formed directly above the deep-trench isolation structures 1601, the mask for forming the trenches 165 may be the same as the mask for forming the trench 112 (see FIG. 3).

Figure 6:
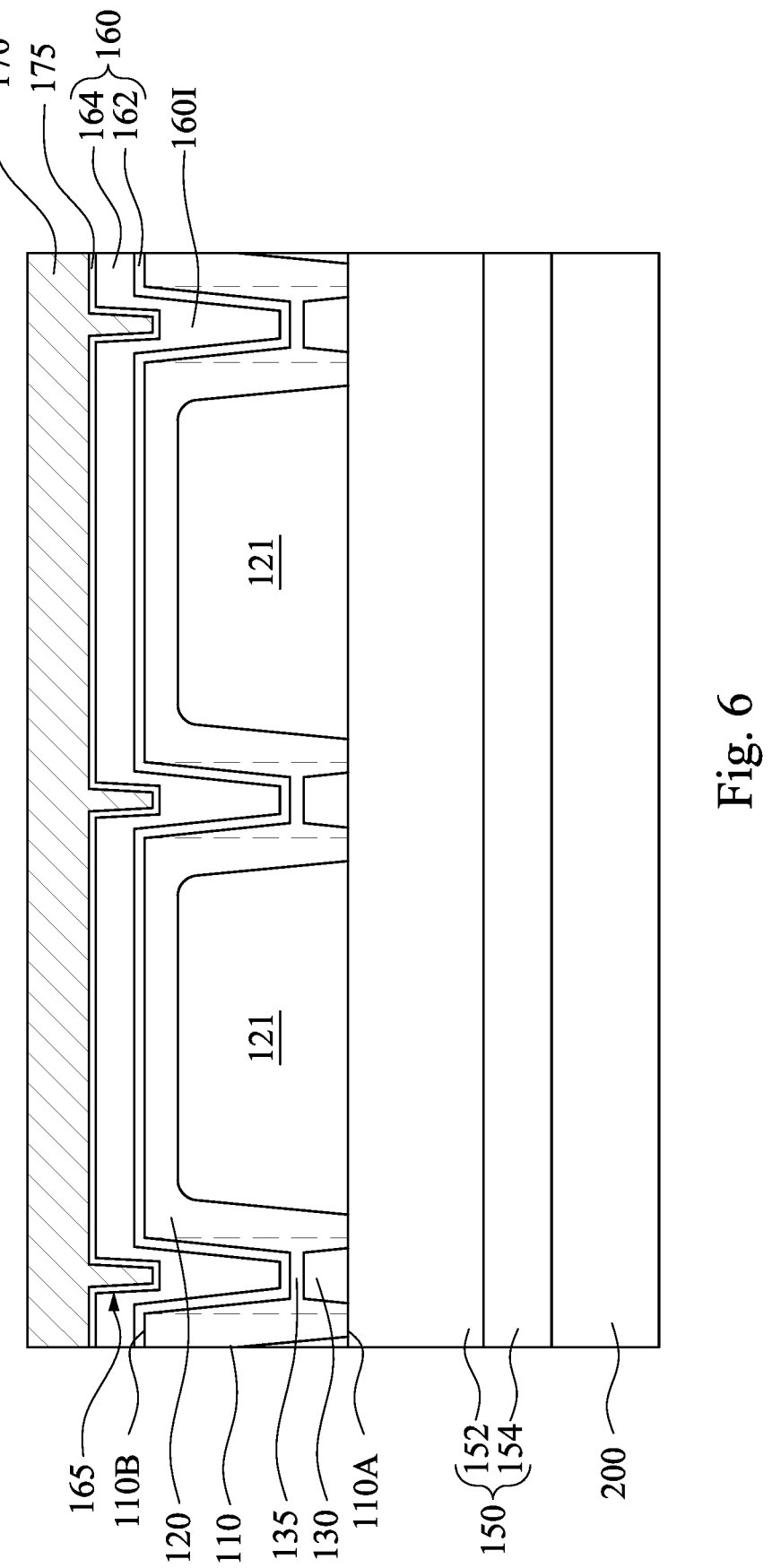

Reference is made to FIG. 6. A light blocking layer 170 is formed over the dielectric layer 160. The light blocking layer 170 may be a metal layer. In some embodiments, the light blocking layer 170 is made of a reflective metal material or a light absorption material. For example, the light blocking layer 170 may include Cu, Au, Ag, Al, Ni, W, alloys thereof, or the like and may be formed using PVD, plating, or the like. In some embodiments, prior to the formation of the light blocking layer 170, a barrier/adhesion layer 175 may be conformally formed over the dielectric layer 160. The barrier/adhesion layer 175 may include titanium, titanium nitride, tantalum, tantalum nitride, or multilayers thereof and may be formed using PVD, CVD, MOCVD, plasma enhanced CVD (PECVD), atomic layer deposition (ALD), electroplating and/or the like.

In some embodiments, the light blocking layer 170 may fill the one or more trenches 165. In some embodiments where the trenches 165 has a grid shape from a top view as illustrated in FIG. 9B, the portions of the light blocking layer 170 in the trenches 165 also has a grid shape from the top view as illustrated in FIG. 9B. The portions of the light blocking layer 170 in the trenches 165 can further block lights between photosensitive pixels 120, thereby preventing cross-talk which may occur when light from one pixel region makes its way into an adjacent pixel region through the dielectric layer 160.

Figure 7:
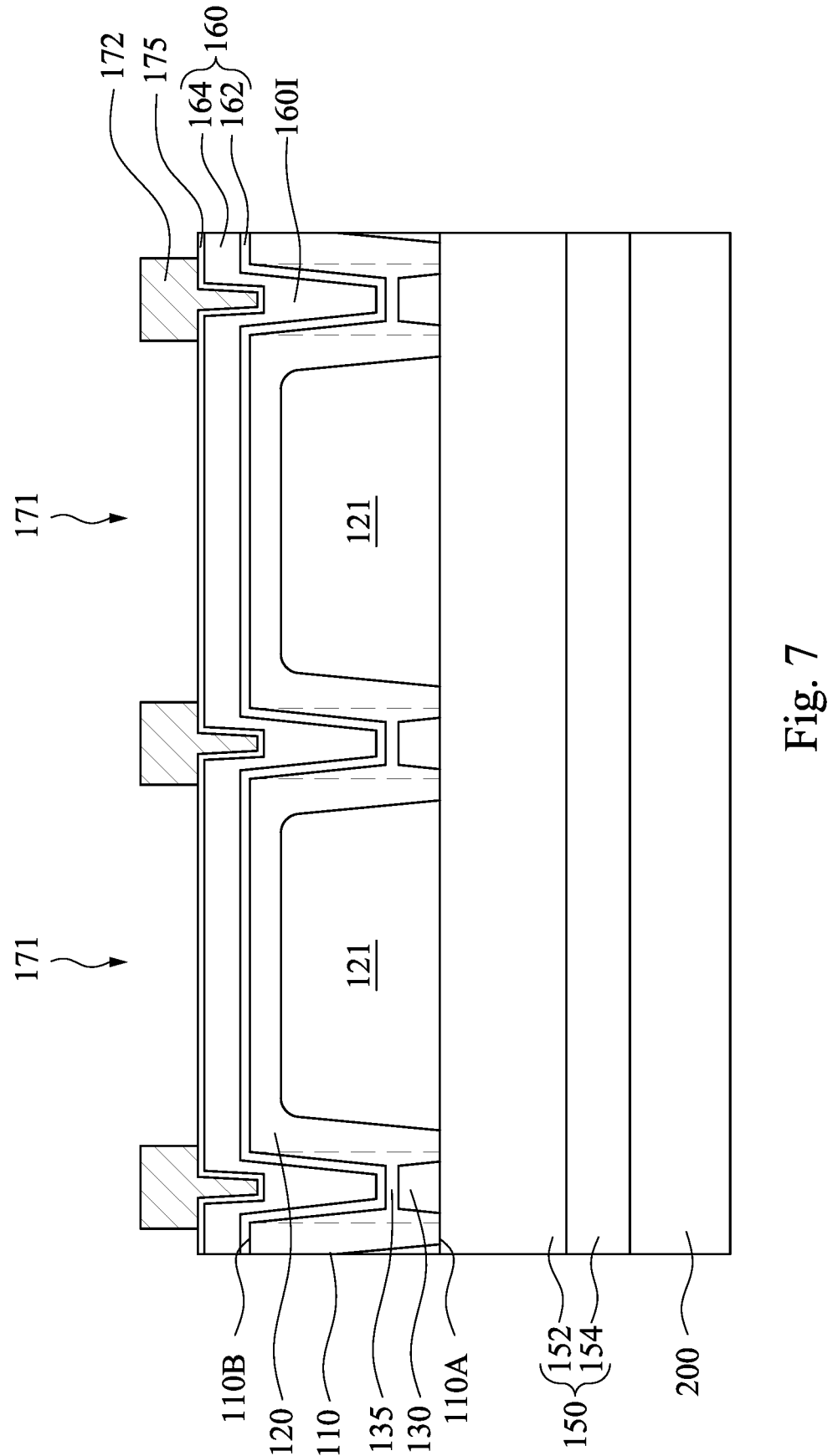

Reference is made to FIG. 7. The light blocking layer 170 (see FIG. 6) is patterned into a light blocking structure 172. The patterning process may include suitable photolithography and etching processes. For example, a patterned mask (e.g., photoresist) is formed over the light blocking layer 170 (see FIG. 6) and exposing portions of the light blocking layer 170. Subsequently, an etching process is performed to remove the exposed portions of the light blocking layer 170, thereby forming openings 171 in the light blocking layer 170. The etching process may include wet etch, dry etch, or the combination thereof. For example, the etching process may include a dry etch using suitable gas etchants. The etching process may be performed until the barrier/adhesion layer 175 (or the dielectric layer 160 when the barrier/adhesion layer 175 is omitted) is exposed. Through the patterning process, the barrier/adhesion layer 175 (or the dielectric layer 160) is exposed through the openings 171 in the light blocking layer 170. In some embodiments, the openings 171 are aligned with respective photosensitive pixels 120.

A remaining portion of the light blocking layer 170 in the pixel array region 102 is referred to as the light blocking structure (or light blocking grid) 172. The light blocking structure 172 has the openings 171 aligned with respective photosensitive pixels 120. For example, in some embodiments, walls of the light blocking structure 172 may encircle each active photosensitive pixel 120 as viewed from top (see FIG. 9B). Through the configuration, the light blocking structure 172 prevents optical cross-talk between neighboring photosensitive pixels 120.

Figure 8:
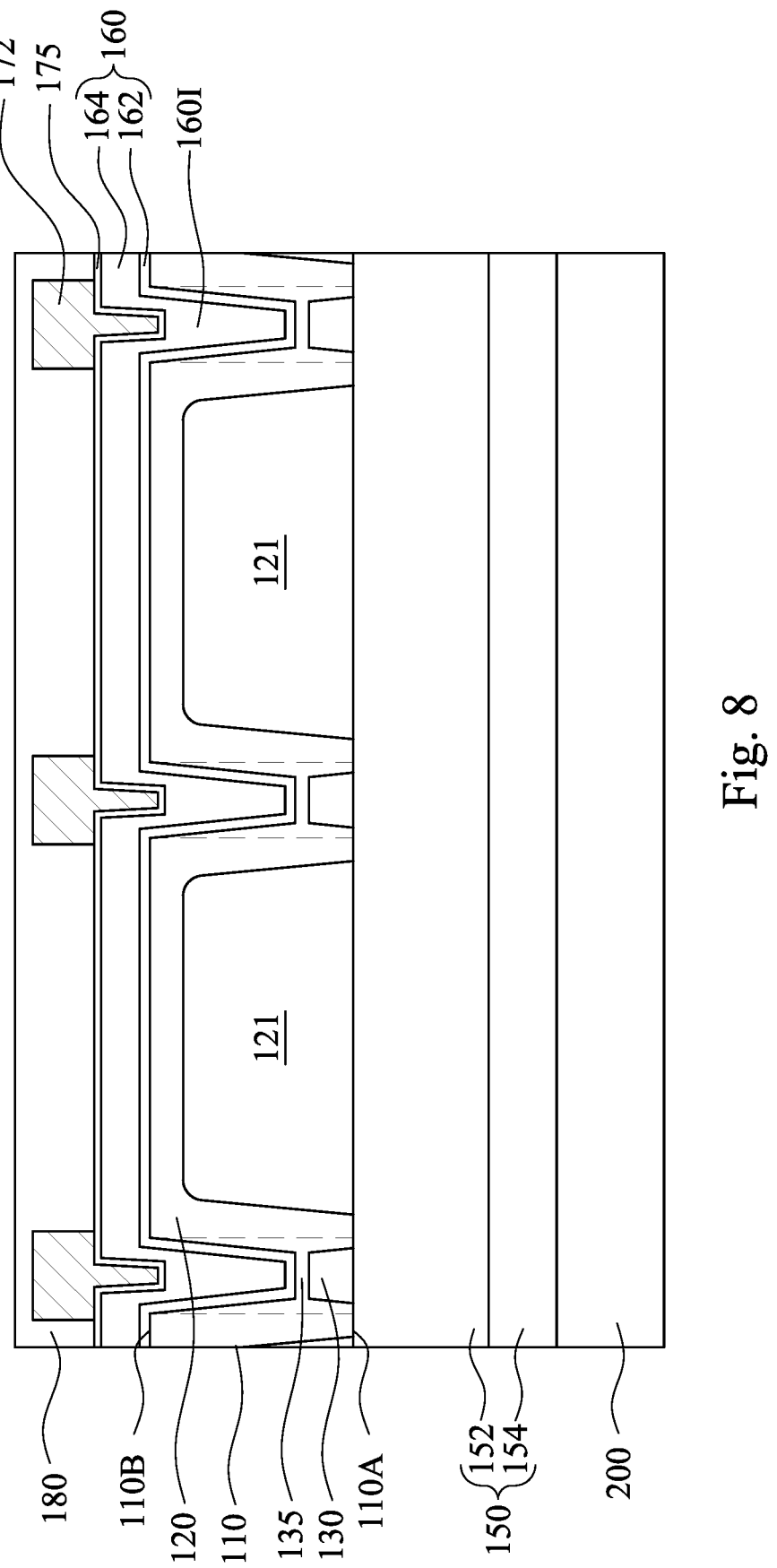

Reference is made to FIG. 8. A dielectric layer 180 is formed over the light blocking structure 172 and fills the openings 171. In some embodiments, the dielectric layer 180 may be formed using similar materials and methods as the buffer layer 164 described above with reference to FIG. 4 and the description is not repeated herein. In some embodiments, the dielectric layer 180 and the buffer layer 164 may be formed of a same material. In some other embodiments, the dielectric layer 180 and the buffer layer 164 may be formed of different materials. Subsequently, the dielectric layer 180 is planarized using a grinding process, a chemical mechanical polishing (CMP) process, an etching process, or the like.

Reference is made to FIGS. 9A and 9B, wherein FIG. 9B is a top view of the image sensor device 100 according to some embodiment, and FIG. 9A is a cross-sectional view taken along line A-A in FIG. 9B. Subsequently, a color filter layer 190 is formed over the dielectric layer 180. In some embodiments, the color filter layer 190 includes plural color filters 192, aligned with respective photosensitive pixels 120. The color filters 192 may be used to allow specific wavelengths of light to pass while reflecting other wavelengths, thereby allowing the image sensor device 100 to determine the color of the light being received by the photosensitive pixels 120. For example, the color filters 192 may be a red, green, and blue filter as used in a Bayer pattern. Other combinations, such as cyan, yellow, and magenta, may also be used. The number of different colors of the color filters 192 may also vary. The color filters 192 may include a polymeric material or resin, such as polymethyl-methacrylate (PMMA), polyglycidyl-methacrylate (PGMA), or the like, that includes colored pigments.

An array of micro-lenses 195 is formed over the color filter layer 190. In some embodiments, the micro-lenses 195 are aligned with respective color filters 192 and respective photosensitive pixels 120. The micro-lenses 195 may be formed of any material that may be patterned and formed into lenses, such as a high transmittance acrylic polymer. In some embodiments, a micro-lens layer may be formed using a material in a liquid state by, for example, spin-on techniques. Other methods, such as CVD, PVD, or the like, may also be used. The planar material for the micro-lens layer may be patterned using suitable photolithography and etching methods to pattern the planar material in an array corresponding to the array of the photosensitive pixels 120. The planar material may then be reflowed to form an appropriate curved surface for the micro-lenses 195. Subsequently, the micro-lenses 195 may be cured using, for example, a UV treatment. In some embodiments, after forming the micro-lenses 195, the carrier substrate 200 (see FIG. 8) may be de-bonded form the image sensor device 100 and the image sensor device 100 may undergo further processing such as, for example, packaging.

In FIGS. 9A and 9B, the image sensor device 100 includes the photosensitive pixels 120, the deep-trench isolation structures 1601, and the light blocking structure 172. The deep-trench isolation structures 1601 surrounds the photosensitive pixels 120 to isolate the photosensitive pixels 120 from each other. The light blocking structure 172 is above the deep-trench isolation structures 1601 to prevent crosstalk which may occur when light from one pixel region makes its way into an adjacent pixel region through the dielectric layer 160.

Figure 9C:
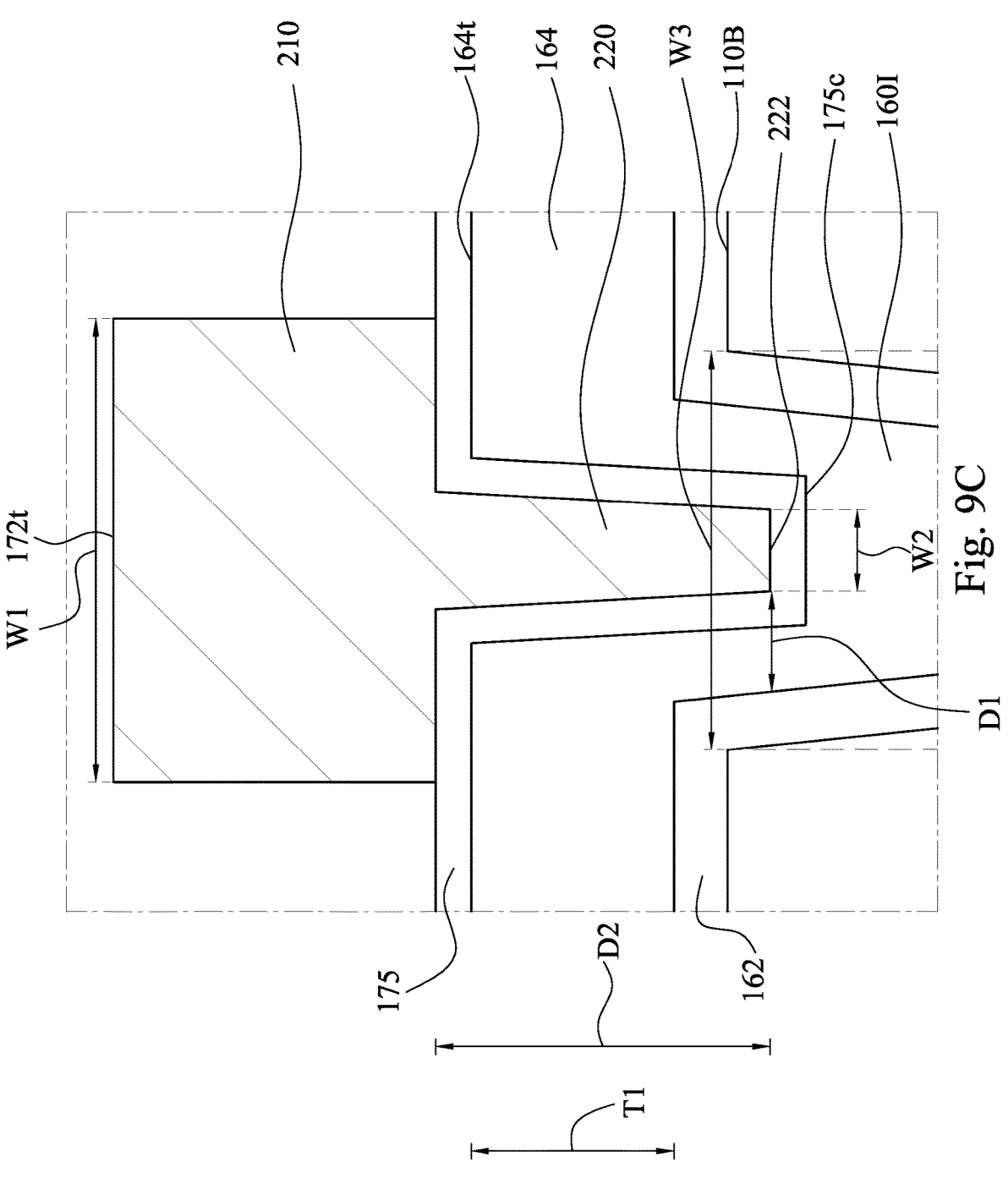

Reference is made to FIGS. 9A-9C, where FIG. 9C is an enlarged view of area P in FIG. 9A. Specifically, the light blocking structure 172 includes a top portion 210 and a bottom portion 220. The top portion 210 is above a topmost surface 164t of the buffer layer 164, and the bottom portion 220 is embedded in (or surrounded by) the buffer layer 164. That is, a top surface 172t of the light blocking structure 172 is higher than the topmost surface 164t of the buffer layer 164. A width W1 of the top portion 210 is greater than a width W2 of the bottom portion 220. That is, the top portion 210 is wider than the bottom portion 220 of the light blocking structure 172. Further, the deep-trench isolation structures 1601 have a maximum width W3 smaller than the width W1 of the top portion 210 and greater than the width W2 of the bottom portion 220 of the light blocking structure 172.

In some embodiments, a bottom surface 222 of the bottom portion 220 of the light blocking structure 172 is lower than a top surface (i.e., the back surface 110B) of the substrate 110. That is, the depth D2 of the bottom portion 220 of the light blocking structure 172 is greater than a thickness T1 of a portion of the buffer layer 164 outside the trench 165 (i.e., a portion of the buffer layer 164 directly above the photosensitive pixels 120).

The barrier/adhesion layer 175 is between the bottom portion 220 of the light blocking structure 172 and the buffer layer 164. A first portion 175a (see FIG. 9A) of the barrier/adhesion layer 175 is directly above the photosensitive region 121, and a second portion 175b (see FIG. 9A) of the barrier/adhesion layer 175 is embedded in the buffer layer 164. However, the barrier/adhesion layer 175 is separated from the charge accumulation layer 162 by the buffer layer 164. In some embodiments, a lateral distance D1 between the charge accumulation layer 162 and a bottom of the bottom portion 220 of the light blocking structure 172 is in a range of about 50 nm to about 500 nm. If the lateral distance D1 is greater than about 500 nm, then the bottom portion 220 of the light blocking structure 172 may not effectively prevent the optically cross-talk among the photosensitive pixels 120. If the lateral distance D1 is less than about 50 nm, then the light blocking structure 172 may be in contact with the photosensitive pixels 120, which may cause electrical cross-talk among the photosensitive pixels 120. In some embodiments, a bottommost surface 175c of the barrier/adhesion layer 175 is lower than the top surface 110B of the substrate 110.

Reference is made to FIG. 9A. The image sensor device 100 further includes the dielectric layer 180 above the light blocking structure 172. In some embodiments, the dielectric layer 180 is in contact with the top portion 210 of the light blocking structure 172 and the barrier/adhesion layer 175. The dielectric layer 180 is spaced apart from the bottom portion 220 of the light blocking structure 172. The dielectric layer 180 may be a single layer or multiple layer, depending on different requirements. The image sensor device 100 further includes the color filter layer 190 including color filters 192 aligned with respective photosensitive pixels 120. The image sensor device 100 further includes the micro-lenses 195 respectively above the color filters 192. It is noted that the arrangement of the dielectric layer 180, the color filters 192, and the micro-lenses 195 in FIG. 9A is illustrative, and should not limit the present disclosure. In some embodiments, the dielectric layer 180 is omitted, and the color filters 192 are respectively formed in the openings 171 (see FIG. 7).

Figure 10A:
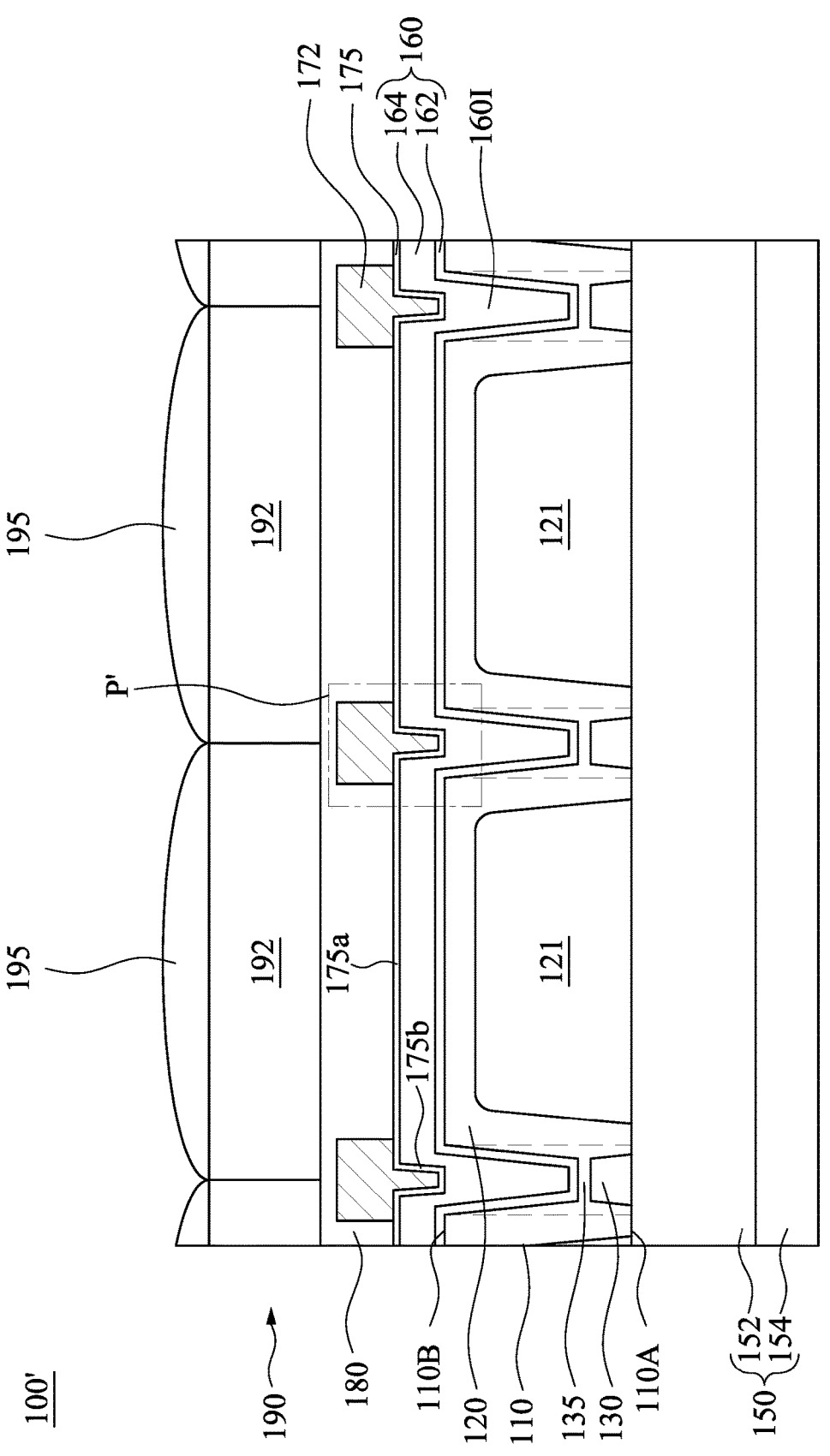
FIG. 10A is a cross-sectional view of an image sensor device in accordance with some embodiments of the present disclosure.
Figure 10B:
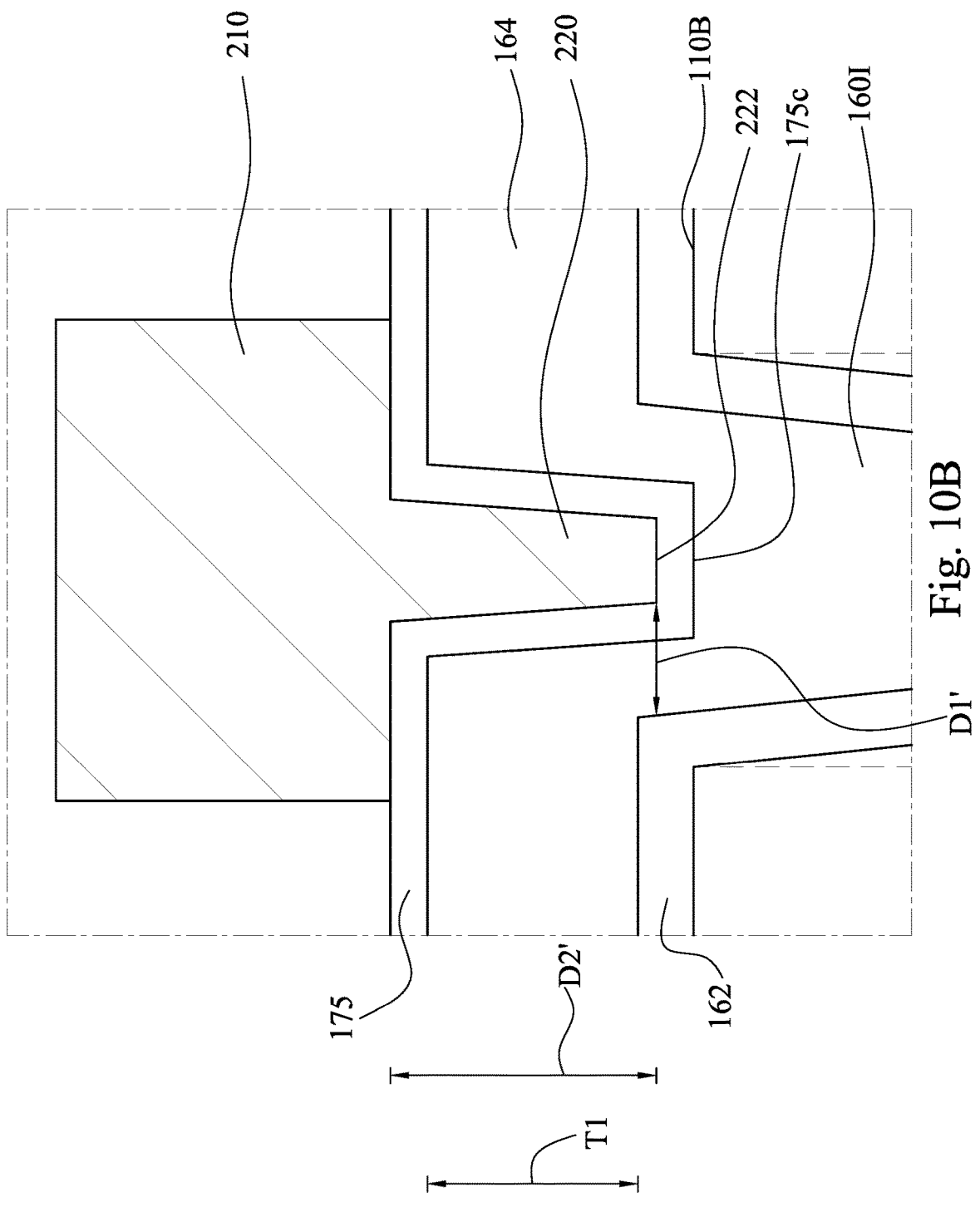
FIG. 10B is an enlarged view of area P' in FIG. 10A.

FIG. 10A is a cross-sectional view of an image sensor device 100' in accordance with some embodiments of the present disclosure, and FIG. 10B is an enlarged view of area P' in FIG. 10A. The difference between the image sensor device 100' in FIGS. 10A and 10B and the image sensor device 100 in FIGS. 9A-9C pertains to the depth of the bottom portion 220 of the light blocking structure 172. In FIGS. 10A-10B, the bottom surface 222 of the bottom portion 220 of the light blocking structure 172 (or the bottommost surface 175c of the barrier/adhesion layer 175) is substantially level with the top surface 110B of the substrate 110. That is, the depth D2' of the bottom portion 220 of the light blocking structure 172 is substantially the same as or slightly greater than the thickness T1 of a portion of the buffer layer 164 outside the trench 165 (i.e., a portion of the buffer layer 164 directly above the photosensitive pixels 120). In some embodiments, a lateral distance D1' between the charge accumulation layer 162 and a bottom of the bottom portion 220 of the light blocking structure 172 is in a range of about 30 nm to about 200 nm. If the lateral distance D1' is greater than about 200 nm, then the bottom portion 220 of the light blocking structure 172 may not effectively prevent the optically cross-talk among the photosensitive pixels 120. If the lateral distance D1' is less than about 30 nm, then the light blocking structure 172 may in contact with the photosensitive pixels 120, which may cause electrical cross-talk among the photosensitive pixels 120. Other relevant structural details of the image sensor device 100' in FIGS. 10A-10B are substantially the same as or similar to the image sensor device 100 in FIGS. 9A-9C, and, therefore, a description in this regard will not be repeated hereinafter.

Figure 11A:
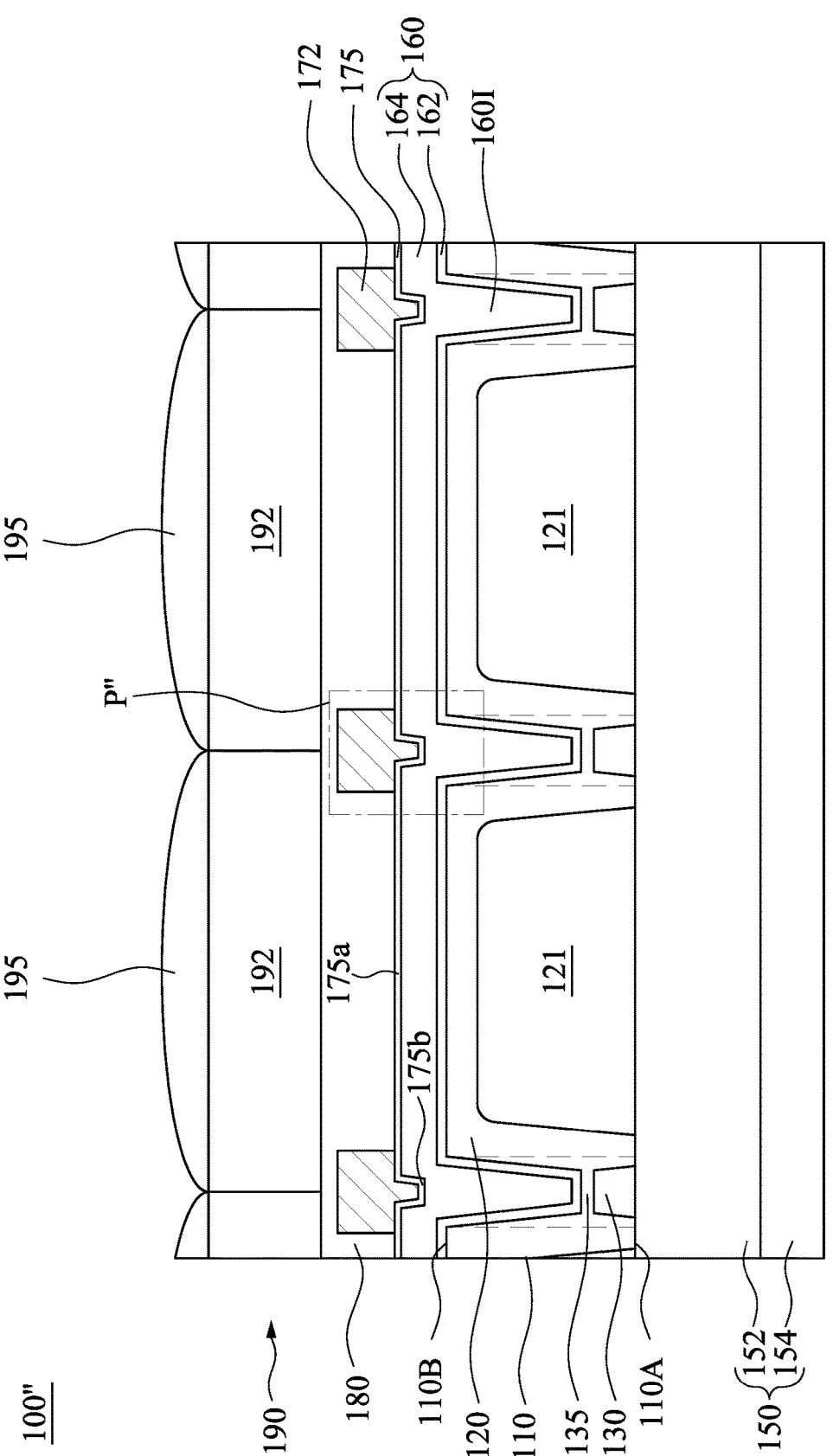
FIG. 11A is a cross-sectional view of an image sensor device 100" in accordance with some embodiments of the present disclosure.
Figure 11B:
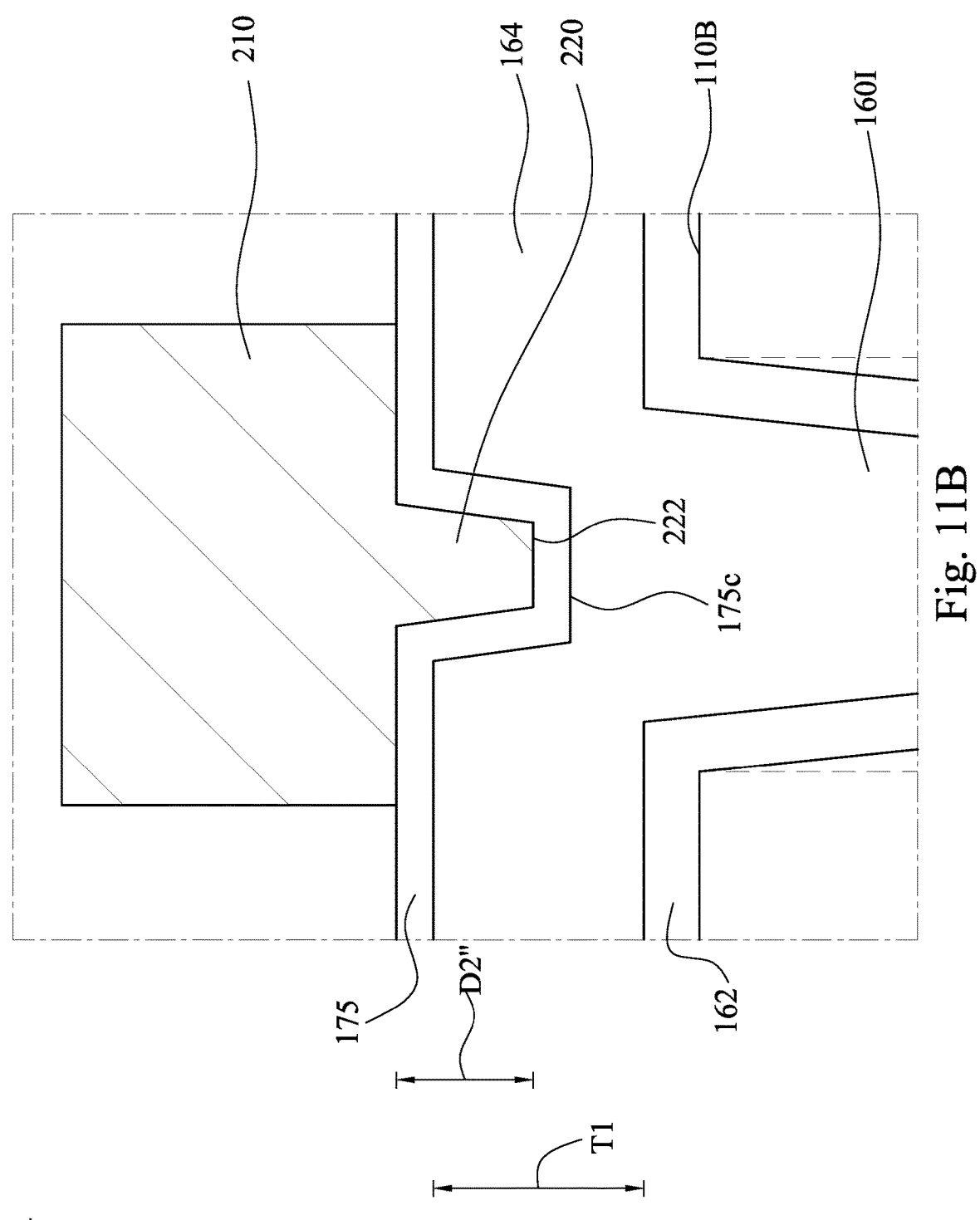
FIG. 11B is an enlarged view of area P" in FIG. 11A.

FIG. 11A is a cross-sectional view of an image sensor device 100" in accordance with some embodiments of the present disclosure, and FIG. 11B is an enlarged view of area P" in FIG. 11A. The difference between the image sensor device 100" in FIGS. 11A-11B and the image sensor device 100 in FIGS. 9A-9C pertains to the depth of the bottom portion 220 of the light blocking structure 172. In FIGS. 11A-11B, the bottom surface 222 of the bottom portion 220 of the light blocking structure 172 (or a bottommost surface 175c of the barrier/adhesion layer 175) is higher than the top surface 110B of the substrate 110. That is, the depth D2" of the bottom portion 220 of the light blocking structure 172 is smaller than the thickness T1 of a portion of the buffer layer 164 outside the trench 165 (i.e., a portion of the buffer layer 164 directly above the photosensitive pixels 120). For example, a difference between the thickness T1 and the depth D2" is greater than about 50 nm and less than the thickness T1. Other relevant structural details of the image sensor device 100" in FIGS. 11A-11B are substantially the same as or similar to the image sensor device 100 in FIGS. 9A-9C, and, therefore, a description in this regard will not be repeated hereinafter.

FIG. 12 is a flow chart of a method M for forming an image sensor device in accordance with some embodiments of the present disclosure. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, a photosensitive pixel is formed in a substrate from a front surface of the substrate. FIG. 1 illustrates a cross-sectional view of some embodiments corresponding to act in block S12. At block S14, a first trench is formed in the substrate from a back surface of the substrate, wherein the first trench surrounds the photosensitive pixel. FIG. 3 illustrates a cross-sectional view of some embodiments corresponding to act in block S14. At block S16, a buffer layer is formed on the substrate and in the first trench. In some embodiments, a portion of the buffer layer in the first trench is referred to as a deep-trench isolation structure. FIG. 4 illustrates a cross-sectional view of some embodiments corresponding to act in block S16. At block S18, a second trench is formed in the buffer layer and above the deep-trench isolation structure. FIG. 5 illustrates a cross-sectional view of some embodiments corresponding to act in block S18. At block S20, a light blocking structure is formed above the buffer layer and in the second trench. FIGS. 6-7 illustrate cross-sectional views of some embodiments corresponding to act in block S20. At block S22, a color filter layer is formed above the light blocking structure. At block S24, micro-lenses are formed above the color filter layer. FIGS. 9A-9C illustrates a cross-sectional view of some embodiments corresponding to act in blocks S22 and S24.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the bottom portion of the light blocking structure further prevents the optical cross-talk among photosensitive pixels through the buffer layer. Another advantage is that since the bottom portion of the light blocking structure is formed above the isolation structure, the trench formations for the bottom portion of the light blocking structure and the isolation structure may use the same mask.

According to some embodiments, an image sensor device includes a substrate, a deep-trench isolation structure, a buffer layer, and a light blocking structure. The substrate has a photosensitive region. The deep-trench isolation structure is in the substrate and adjacent the photosensitive region. The buffer layer is over the photosensitive region and the deep-trench isolation structure. The light blocking structure is over the buffer layer. A bottom portion of the light blocking structure is embedded in the buffer layer.

According to some embodiments, an image sensor device includes a substrate, a buffer layer, a light blocking structure, and an adhesion layer. The substrate has a photosensitive region. The buffer layer is above the substrate. The light blocking structure is above the buffer layer. The adhesion layer is between the light blocking structure and the buffer layer. A first portion of the adhesion layer is directly above the photosensitive region, and a second portion of the adhesion layer is embedded in the buffer layer.

According to some embodiments, a method for manufacturing an image sensor device includes forming a photosensitive pixel in a substrate. A first trench is formed in the substrate to surround the photosensitive pixel. A buffer layer is formed on the substrate and in the first trench to form a deep-trench isolation structure in the first trench. A second trench is formed in the buffer layer and above the deep-trench isolation structure. A light blocking structure is formed above the buffer layer and partially in the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device comprising:
a substrate having a photosensitive region;
a deep-trench isolation structure in the substrate and adjacent the photosensitive region;
an oxide layer over the photosensitive region and the deep-trench isolation structure;
a light blocking structure over the oxide layer, wherein a bottom portion of the light blocking structure is embedded in the oxide layer; and
an adhesion layer between the light blocking structure and the oxide layer, wherein the adhesion layer extends beyond a sidewall of a top portion of the light blocking structure, a bottommost surface of the adhesion layer is higher than a topmost surface of the photosensitive region, and the adhesion layer is in direct contact with the oxide layer and the deep-trench isolation structure.

2. The image sensor device of claim 1, wherein a top surface of the light blocking structure is higher than a top surface of the oxide layer.

3. The image sensor device of claim 1, wherein a width of the top portion of the light blocking structure is greater than a width of the bottom portion of the light blocking structure.

4. The image sensor device of claim 1, wherein a width of the top portion of the light blocking structure is greater than a width of the deep-trench isolation structure.

5. The image sensor device of claim 1, further comprising a dielectric layer that covers the light blocking structure.

6. The image sensor device of claim 5, wherein the dielectric layer is spaced apart from the bottom portion of the light blocking structure.

7. An image sensor device comprising:
a substrate having a photosensitive region;
a deep-trench isolation structure in the substrate and adjacent the photosensitive region;
an oxide layer above the substrate;
a light blocking structure above the oxide layer; and
an adhesion layer between the light blocking structure and the oxide layer, wherein a first portion of the adhesion layer is directly above the photosensitive region and not covered by the light blocking structure, a second portion of the adhesion layer is embedded in the oxide layer, a bottommost surface of the second portion of the adhesion layer is higher than a topmost surface of the photosensitive region, a thickness of the oxide layer is greater than a thickness of the adhesion layer, and the adhesion layer is in direct contact with the oxide layer and the deep-trench isolation structure.

8. The image sensor device of claim 7, wherein the bottommost surface of the second portion of the adhesion layer is lower than a top surface of the substrate.

9. An image sensor device comprising:
a substrate having a first surface and a second surface opposite to the first surface, wherein the substrate further has a photosensitive region closer to the first surface than to the second surface;
a deep-trench isolation structure in the substrate and adjacent the photosensitive region;
a first light blocking structure and a second light blocking structure over the substrate and on opposite sides of the photosensitive region, wherein a bottommost surface of the first light blocking structure is lower than the second surface of the substrate;
an adhesion layer below the first light blocking structure and the second light blocking structure, wherein the adhesion layer comprises:
a first portion in contact with the bottommost surface of the first light blocking structure;
a second portion in contact with a bottommost surface of the second light blocking structure, wherein the first and second portions of the adhesion layer are higher than a topmost surface of the photosensitive region; and
a third portion interconnecting the first portion and the second portion of the adhesion layer;
a high-k dielectric layer between the adhesion layer and the substrate and comprising:
an upper portion directly between the third portion of the adhesion layer and the photosensitive region; and
a lower portion below the bottommost surface of the first light blocking structure and in direct contact with the substrate; and
an oxide layer over the photosensitive region, the high-k dielectric layer, and the deep-trench isolation structure, wherein the adhesion layer is in direct contact with the oxide layer and the deep-trench isolation structure.

10. The image sensor device of claim 7, wherein a bottommost surface of the oxide layer is lower than the topmost surface of the photosensitive region.

11. The image sensor device of claim 9, wherein a top surface of the third portion of the adhesion layer is higher than the second surface of the substrate.

12. The image sensor device of claim 9, further comprising a color filter over the first light blocking structure and the second light blocking structure, wherein the third portion of the adhesion layer is directly between the color filter and the photosensitive region.

13. The image sensor device of claim 1, further comprising:
a dielectric layer over the light blocking structure, wherein a bottom surface of the dielectric layer is higher than a bottom surface of the bottom portion of the light blocking structure.

14. The image sensor device of claim 13, wherein a bottommost surface of the adhesion layer is lower than the bottom surface of the dielectric layer.

15. The image sensor device of claim 7, further comprising:
a dielectric layer over the light blocking structure, wherein a bottom surface of the dielectric layer is higher than a bottommost surface of the light blocking structure.

16. The image sensor device of claim 1, wherein the oxide layer is in material continuity with the deep-trench isolation structure.

17. The image sensor device of claim 7, wherein the oxide layer is spaced apart from the substrate.

18. The image sensor device of claim 7, wherein the adhesion layer is in direct contact with the light blocking structure.

19. The image sensor device of claim 1, wherein there is no interface between the oxide layer and the deep-trench isolation structure.

20. The image sensor device of claim 7, further comprising a high-k dielectric layer between the oxide layer and the substrate.

* * * * *